United States Patent
Lewis et al.

(10) Patent No.: US 11,378,532 B2
(45) Date of Patent: Jul. 5, 2022

(54) INSPECTION SYSTEM AND INSPECTION METHOD TO QUALIFY SEMICONDUCTOR STRUCTURES

(71) Applicants: Carl Zeiss SMT GmbH, Oberkochen (DE); Carl Zeiss Microscopy, LLC, Thornwood, NY (US)

(72) Inventors: Brett Lewis, Arlington, MA (US); Wilhelm Kuehn, Koenigsbronn (DE); Deying Xia, Belmont, MA (US); Shawn McVey, Newton, NH (US); Ulrich Mantz, Schelklingen (DE)

(73) Assignees: Carl Zeiss SMT GmbH, Oberkochen (DE); Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 17/129,686

(22) Filed: Dec. 21, 2020

(65) Prior Publication Data

US 2021/0109046 A1    Apr. 15, 2021

Related U.S. Application Data

(63) Continuation of application No. PCT/EP2019/064912, filed on Jun. 7, 2019.
    (Continued)

(30) Foreign Application Priority Data

Jul. 25, 2018    (DE) .......................... 102018212403.5

(51) Int. Cl.
    *G01N 23/2258* (2018.01)
    *H01J 37/26* (2006.01)
    (Continued)

(52) U.S. Cl.
    CPC .......... *G01N 23/2258* (2013.01); *H01J 37/26* (2013.01); *H01J 49/142* (2013.01); *H01L 21/67288* (2013.01)

(58) Field of Classification Search
    CPC .... G01N 23/2258; H01J 37/26; H01J 49/142; H01L 21/67288
    See application file for complete search history.

(56) References Cited

U.S. PATENT DOCUMENTS

2007/0221843 A1    9/2007    Ward et al.
2009/0114840 A1    5/2009    Ward et al.
(Continued)

FOREIGN PATENT DOCUMENTS

CN    106 233 421 A    12/2016
CN    107 438 891 A    12/2017
(Continued)

OTHER PUBLICATIONS

International Search Report and Written Opinion for corresponding PCT Appl No. PCT/EP2019/064912, dated Sep. 16, 2019.
(Continued)

*Primary Examiner* — Nicole M Ippolito
*Assistant Examiner* — Hanway Chang
(74) *Attorney, Agent, or Firm* — Fish & Richardson P.C.

(57) ABSTRACT

An inspection system serves to qualify semiconductor structures. The inspection system has an ion beam source for space-resolved exposition of the structures to be qualified with an ion beam. The inspection system also includes a secondary ion detection device with a mass spectrometer. The mass spectrometer is configured to measure an ion mass to charge ratio in a given bandwidth.

20 Claims, 8 Drawing Sheets

Related U.S. Application Data (60) Provisional application No. 62/689,329, filed on Jun. 25, 2018.

(51) Int. Cl.
  *H01J 49/14*   (2006.01)
  *H01L 21/67*   (2006.01)

(56) References Cited

U.S. PATENT DOCUMENTS

| | | |
|---|---|---|
| 2009/0272890 A1 | 11/2009 | Ogawa et al. |
| 2016/0086769 A1 | 3/2016 | Kim et al. |

FOREIGN PATENT DOCUMENTS

| | | |
|---|---|---|
| DE | 10 2016 201 317 A1 | 11/2016 |
| DE | 10 2017 210 162 A1 | 8/2017 |
| WO | WO 2008/152 132 A2 | 12/2008 |

OTHER PUBLICATIONS

G. Hlawacek and A. Gölzhäuser (eds.), Helium Ion Microscopy, Nanoscience and Technology, Springer International Publishing, Switzerland, 2016.

German Examination Report, with translation thereof, for corresponding DE Appl No. 10 2018212 403.5, dated Mar. 29, 2019.

Taiwanese Office Action with English translation thereof, for corresponding TW Appl 108121314, dated Jan. 8, 2020.

Taiwanese Office Action, with English translation thereof, for corresponding TW Appl 108121314, dated Sep. 3, 2020.

INSPECTION SYSTEM AND INSPECTION METHOD TO QUALIFY SEMICONDUCTOR STRUCTURES

CROSS-REFERENCE TO RELATED APPLICATIONS

The present application is a continuation of, and claims benefit under 35 USC 120 to, international application PCT/EP2019/064912, filed Jun. 7, 2019, which claims priority to German application 10 2018 212 403.5, filed Jul. 25, 2018, and to US provisional application 62/689,329, filed Jun. 25, 2018, the content of which are incorporated herein by reference.

FIELD

The disclosure relates an inspection system to qualify semiconductor structures. Further, the disclosure relates to an inspection method to qualify semiconductor structures.

BACKGROUND

An inspection system and also an inspection method to qualify 3D semiconductor structures is known from US 2007/0221843 A1, US 2009/0114840 A1, and G. Hlawacek and A. Gölzhäuser (eds.), Helium Ion Microscopy, Nanoscience and Technology, Springer International Publishing, Switzerland, 2016. WO 2008/152 132 A2 discloses an apparatus and a method for performing secondary ion mass spectroscopy.

SUMMARY

The present disclosure seeks to improve such an inspection system for qualification of semiconductor structures, in particular for qualification of 2D or 3D semiconductor structures.

In an aspect, the disclosure provides an inspection system to qualify semiconductor structures. The inspection system includes an ion beam source for space-resolved exposition of the structures to be qualified with an ion beam. The inspection system also includes a secondary ion detection device. The secondary ion detection device includes a mass spectrometer configured to simultaneously measure an ion mass to charge ratio in a given bandwidth.

It has been recognized that the use of a mass spectrometer to simultaneously measure ion mass to charge ratios in a given bandwidth together with the use of an ion beam source to produce secondary ions to be detected by the mass spectrometer can yield a powerful tool for qualifying semiconductor structures. The bandwidth within which the simultaneous measurement of the ion mass to charge ratio is done via the mass spectrometer is an ion mass to charge ratio band between a lower boundary value of the ion mass to charge ratio and an upper boundary value of the ion mass to charge ratio. The system can be used to qualify 2D and/or 3D structures. The system is capable of placing a well-defined, confined ion beam at an object or sample to be qualified. Further, the system may correlate high resolution secondary ion imaging on the one hand with analytic information obtained via mass spectroscopy on the other. The system may include a secondary electron imaging optics. The secondary ion mass spectrometer can provide for the possibility to simultaneously trace different ion mass to charge ratios and therefore giving respective information with respect to different materials and/or elements and/or isotopes present in a sample region. Further, it has been recognized that results of such an inspection system are not compromised by the use of a low current ion beam which can be provided with high space-resolution and also with a very small focal diameter. The space-resolution may be better than 100 nm, better than 50 nm and may be better than 20 nm. A focal diameter of the ion beam may be smaller than 10 nm, smaller than 5 nm, smaller than 2 nm, smaller than 1 nm and even may be smaller than 0.5 nm. The inspection system may be used as part of an apparatus for review and/or removal of defects in the qualified semiconductor structures. The inspection system may be used for review of specific structures, for example for inspection and review of high aspect ratio (HAR) contact coils. Such inspection and review steps may take place during a manufacturing process of the respective semiconductor structure.

The inspection system according to the disclosure has a wide variety of applications. Some of them are discussed in the following:

One application is the measurement of a critical dimension (CD) using secondary ion mass spectrometry (SIMS) that scopes with the growing complexity and range of materials used in semiconductor devices. Due to the use of the mass spectrometer, the inspection system is capable to distinguish between elements based on mass. This can be leveraged to complete classical CD measurements of semiconductor devices which do not yield any elemental/chemical information. The secondary electron yield in traditional ion microscopy only provides grey levels per element for qualitative analysis.

A further application of the inspection system according to the present disclosure is the organic film characterization. This application points to the directed self-assembly (DSA) for wafer patterning. Such DSA steam often utilized block co-polymers to form structures which have typical dimensions between 10 nm and 100 nm (nanoscale). Distinguishing between different types of organic polymers at the nanoscale is very important in the development of methods using DSA. The inspection system according to the disclosure has the capability to directly distinguish between different types of polymers using characteristic fingerprint measured with the mass spectrometer.

A further application of the inspection system is the single and buried defect detection. The detection and analysis of a chemical make-up of single defects on a wafer is important to access the origin of such defects. Also, chemical information on about buried defects and a surrounding layer can be determined with the inspection system.

A further application of the inspection system is an etch residue characterization. Such analysis of etch residues on wafers gives valuable information. In particular, a stoichiometric variation of etch chemicals is of interest to determine a cause of incomplete/defective etching or defective subsequent process steps, which are caused by etch residues within confined volumes such as trenches, holes, corners, etc. Using the inspection system according to the disclosure which may have a high spatial resolution and/or a high surface sensitivity makes it possible to interrogate the stoichiometric variation across various device topologies.

The mass spectrometer may be capable of continuously measuring the ion mass to charge ratios in the given bandwidth. Such a mass spectrometer can further enhance the information output of the inspection system. In the chosen mass to charge ratio bandwidth, all ion mass to charge ratios present there can be detected simultaneously. The chosen ion mass to charge ratio bandwidth may include a bandwidth capable for simultaneously detecting the elements silicon, titanium, copper, selenium, tellurium andantimony. The resulting mass bandwidth may be in a range between 1 u (unified atomic mass unit) to 500 u.

The secondary ion detection device may include a secondary electron detection unit. Such a secondary electron detection unit can enable a secondary ion detection with high accuracy and high efficiency. A useful yield (ratio of the number of secondary ions which can be measured via the inspection system to the number of sputtered particles produced by the ion beam) may be high. The useful yield may range from $10^{-5}$ to 0.1.

The ion beam source may produce a noble gas ion beam, such as a neon ion beam. Such ion beams have been proven to be in particular useful for the inspection system.

The secondary ion detection device may include a secondary ion transfer unit which is movable between: a first transfer position in which the transfer unit transfers secondary ions which emanate from a target volume of a probe structure to be qualified to the secondary ion detection unit; and a second neutral position. Such a secondary ion transfer unit can enable an interchange between a semiconductor structure production mode of an apparatus which can be used as a projection exposure apparatus and in addition an inspection mode with the secondary ion transfer unit in the transfer position. This can allow an inspection inline during a semiconductor production process.

The secondary ion detection unit may include a total ion counter total ion counter. Such a secondary ion detection unit can give, for example, ratio information about the occurrence distribution of different elements in a sampled region.

The secondary ion detection unit may include an extended detector array for mass filtered signals. Such an extended detector array may give a high spatial resolution of the secondary ion detection device which can result in a high mass resolution. The detector array may be embodied as an array of channel electron multipliers (CEMs) or as a microchannel plate (MCP).

The disclosure also seeks to improve an inspection method to qualify semiconductor structures, in particular to qualify 2D or 3D semiconductor structures.

In an aspect, the disclosure provides an inspection method to qualify semiconductor structures. The method includes raw review of the structure to be qualified, and detailed review of qualification volume candidates identified in the raw review. The detailed review includes: space-resolved ion beam sputtering in the volume to be reviewed in detail; detecting secondary ions from the volume to be reviewed in detail; and performing a continuous mass spectrometry of the detected secondary ions. The continuous mass spectrometry is performed simultaneously within an ion mass to charge ratio bandwidth.

It has been recognized that a combination of a raw review of the structure to be qualified on the one hand and a detailed review of qualification volume candidates identified in the raw review step using an ion beam and a secondary ion detection device enables an inspection of sample regions/volumes to be reviewed in detail with high accuracy and high informative value. The volumes to be reviewed in detail can be chosen using the raw review step which may be performed via a secondary electron microscopy image. The detailed review based on the ion beam and the secondary ion detection device then can be performed based on the raw information derived from the raw review. Performing the continuous mass spectrometry leads to the possibility of gathering detailed element distribution information of the volume to be review in the detailed review step. With such an inspection method, an assessment of the quality of a semiconductor structure to be qualified is possible with use of the results of the raw review of the structure to be qualified on the one hand and of the detailed review of the qualification volume candidates identified in the raw review step on the other.

A lateral space resolution during detailed review may be better than 100 nm. Such a lateral space resolution can give a high informative value. Tiny structural details which may correspond to the resolution of a semiconductor structure process may be reviewed in detail.

The ion beam may be focused in the volume to be reviewed in detail with a focal diameter which is smaller than 5 nm. Such a focus diameter can have corresponding advantages.

The inspection may be performed inline during a semiconductor production. This may be a very effective approach. In addition or alternatively, the inspection method may be used to perform a failure analysis through an object or sample surface and/or used to perform a defect detection. Such failure analysis/defect detection may take place in an offline mode (not during a semiconductor production process).

At least one volume to be reviewed in detail may be chosen via a secondary electron microscopy image. Related advantages have been discussed above already.

A material distribution revealed from the continuous mass spectrometry of the detected secondary ions may be imaged via a secondary electron microscope. Such microscope imaging as part of the inspection method can allow a depiction of a material distribution, the different materials contributing to such distribution further being deducible from the continuous mass spectrometry. This electron microscopy imaging may then allow a visualization of the distribution of the various materials identified via the continuous mass spectrometry.

BRIEF DESCRIPTION OF THE DRAWINGS

Exemplary embodiments of the disclosure are explained below with reference the drawings, in which.

EXEMPLARY EMBODIMENTS

Figure 1:
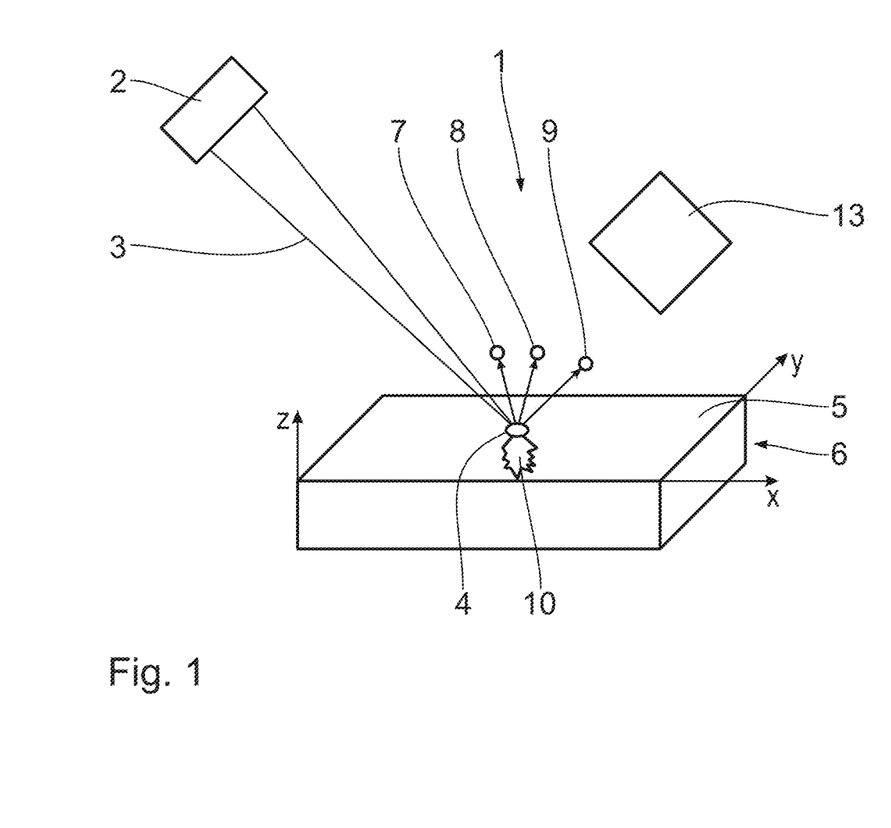
FIG. 1 shows a schematic illustration of the beam/particle interaction in an inspection system to qualify 3D semiconductor structures.
Figure 2:
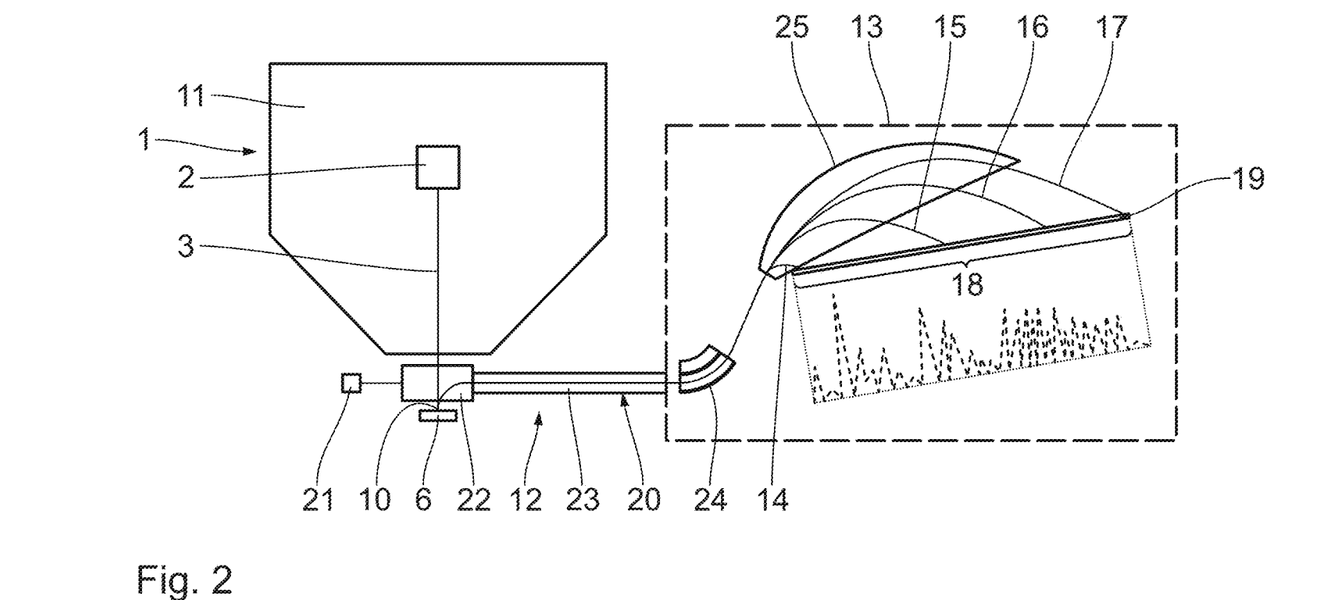
FIG. 2 shows components of an inspection system.

FIGS. 1 and 2 show the working principle and main components of an inspection system 1 to qualify three-dimensional (3D) semiconductor structures, in particular to qualify lithography photomasks. Such photomasks in particular can be suitable for EUV projection lithography.

The inspection system 1 has an ion beam source 2 which schematically is shown in FIG. 1. Such ion beam source 2 is a plasma source with a well-defined source volume. Examples for such an ion beam source are disclosed in US 2007/0221843 A1. The ions produced by the ion beam source are noble gas ions, in particular helium or neon ions. Other noble gases including argon, krypton or xenon may be used as well by providing a respective ion beam source.

The ion beam source produces an ion beam 3 having well-defined pointing characteristics. The space resolution obtained by such ion beam 3 is better than 20 nm. The ion beam 3 is focused on an object field 4 on a surface 5 of an object or a sample 6 having the 3D structures to be qualified by the inspection system 1. A focal diameter of the ion beam 3 is smaller than 0.5 nm.

The ion beam may have an energy in the range from 2.5 keV to 30 keV, for example of 25 keV. A beam current of the ion beam may be in the range of 1 to 100 pA and in particular in the range of 10 pA.

FIG. 1 shows schematically the interaction of the focus ion beam 3 in the object field 4 with material of the object 6. Shown are three kinds of atoms 7, 8, 9 sputtered from the object field of the surface 5 by the ion beam 3. Atom 7 is positively charged. Atom 8 is neutral. Atom 9 is negatively charged. Further shown are several secondary electrons (SE) which are produced during that sputtering and which are denoted with e– in FIG. 1. Further shown in FIG. 1 is a beam interaction region 10, where interaction between the ion beam 3 and the material of the object 6 takes place during the sputtering process.

Shown in FIG. 1 is further a Cartesian x/y/z coordinate system. The coordinates x and y span up the surface 5 of the object 6. The coordinate z is perpendicular to such x/y surface plane.

Such beam interaction region 10 as a very well-defined volume having x/y-dimensions in the range of 5 nm to 50 nm and having a z-dimension in the range of 5 nm and 50 nm. The inspection system 1 includes a secondary electron optics 11 which is capable to produce a secondary electron image of the object field 4. Such secondary electron optics also is disclosed in US 2007/0221843 A1. The system 1 may also have a projection optics of a projection exposure apparatus for EUV lithography. During such semiconductor manufacturing process, a three-dimensional structure can be produced by imaging a reticle on the object field 4 with the projection exposure apparatus using the projection optics.

The inspection system 1 further includes a secondary ion detecting device 12 for detecting secondary ions, in particular the charged atoms 7 and 9 resulting from the ion beam sputtering. The secondary ion detection unit 12 includes a mass spectrometer 13. The mass spectrometer 13 is capable of secondary ion mass spectrometry (SIMS). Such mass spectrometer 13 is capable to measure and in particular to continually measure ion mass to charge ratios of the secondary ions in a given bandwidth. This is schematically shown in FIG. 2, depicting secondary ion beam paths 14, 15, 16, 17 corresponding to different ion mass to charge ratios. After the secondary ions are collected by an extraction optics, they are uniformly accelerated at e.g. 3 kV towards a magnetic sector.

The beam path 14 relates to a smallest detectable ionmass. The beam path 17 relates to a largest detectable ionmass. Between this smallest and this largest ionmass, there is a continuous ion mass bandwidth 18, which is detectable by the mass spectrometer 13.

Schematically depicted in FIG. 2 is a diagram showing an accumulated counting result in this ion mass to charge bandwidth 18 after a certain measurement period of the inspection system 1. Shown are accumulated counting rates for a variety of different ion mass to charge ratios corresponding to respectively different elements. For measuring the ion energies, the mass spectrometer 13 includes a secondary electron detection unit 19 including a total ion counter. The secondary ion detection unit 19 is embodied as an extended detector array. An example of such detector array is an array of channel electron multipliers (CEM). The secondary ion detection unit may include 4 or more such channel electron multipliers, e.g. 4, 5, 6, 8, 10, 15, 20, 25, 30, 50, 75, 100 or even a larger number of channel electron multipliers. The secondary ion detection unit 19 may be embodied as a micro-channel plate (MCP) with more than 50, more than 100, more than 200, more than 500, more than 1000, more than 2000 or even more than 4000 channels.

The secondary ion detection unit further includes a secondary ion transfer unit 20. Such secondary ion transfer unit 20 is movable between a first position shown in FIG. 2 in which the secondary ion transfer unit 20 transfers secondary ions (i.e. charged atoms 7, 9) which emanate from the beam interaction region, i.e. which emanate from a target volume of a probe structure to be qualified, to the mass spectrometer 13 and in particular to the secondary ion detection unit 19, and a second neutral position in which the secondary ion transfer unit 20 does not counteract with secondary electrons and/or secondary ion produced in the beam interaction region. To achieve such movability of the secondary ion transfer unit 20 between the first transfer position and the second neutral position, the secondary ion transfer unit 20 interacts with a drive 21.

The secondary ion transfer unit 20 includes a first deflection mechanism 22, which in the transfer position of the secondary ion transfer unit 20 is located directly above the beam interaction region 10. The deflection mechanism 22 includes a through channel for passing the ion beam 3 in the beam paths between the ion beam source 2 and the beam interaction region 10. Further, the secondary ion transfer unit 20 includes a beam tube 23 for encapsulating the secondary ion beam path between the deflection mechanism 22 and the mass spectrometer 13. The mass spectrometer 13 itself includes two further deflection mechanisms 24, 25, the latter serving as the magnetic sector to spread up the secondary ion beam path 14 to 17 onto the secondary ion detection unit 19. The secondary ion detection unit 19, i.e. the CEMs, is arranged at a focal plane of the magnetic sector 25. The CEMs are used to directly measure the secondary ions which have different trajectories based on their mass to charge ratio (compare beam paths 14 to 17 in FIG. 2)

The deflection mechanism 22 is embodied as an electrostatic sector.

The deflection mechanism 24 is embodied as an electrostatic sector.

The secondary ions are collected from the sample 6 and electrostatically focused, accelerated and projected on a focal plane of the secondary ion detection unit 19. The mass spectrometer 13 may have a Mattauch-Herzog design.

In a typical operation mode of the system 1, the magnetic field of the magnetic sector 25 and the position of the secondary electron detection unit 19 is kept constant and a count rate on the respective channels of the secondary ion detection unit 19 is measured during buffering the sample 6 to obtain volumetric information about this sample.

A mass resolution of the mass spectrometer 13 is sufficient to distinguish not only different elements but individual isotopes as well.

A measurement of an ion mass to charge ratio bandwidth may in an alternate operation mode be produced by sweeping the magnetic field of the magnetic sector 25 and/or by moving individual detectors or the whole secondary ion detection unit 19.

An embodiment, in particular of the deflection mechanism 24, 25 and of the secondary ion transfer unit is disclosed in G. Hlawacek and A. Gölzhäuser (eds.), Helium Ion Microscopy, Nanoscience and Technology, Springer International Publishing, Switzerland, 2016, in particular in chapter 13 of Tom Wirtz et al. "SIMS on the helium ion microscope: The powerful tool for high-resolution high-sensitivity Nano-analytics".

Using the inspection system 1, an inspection method to qualify 3D semiconductor structures in the following is described with reference to FIGS. 3 to 10.

The inspection method includes a step of raw review of the structure to be qualified.

Figure 3:
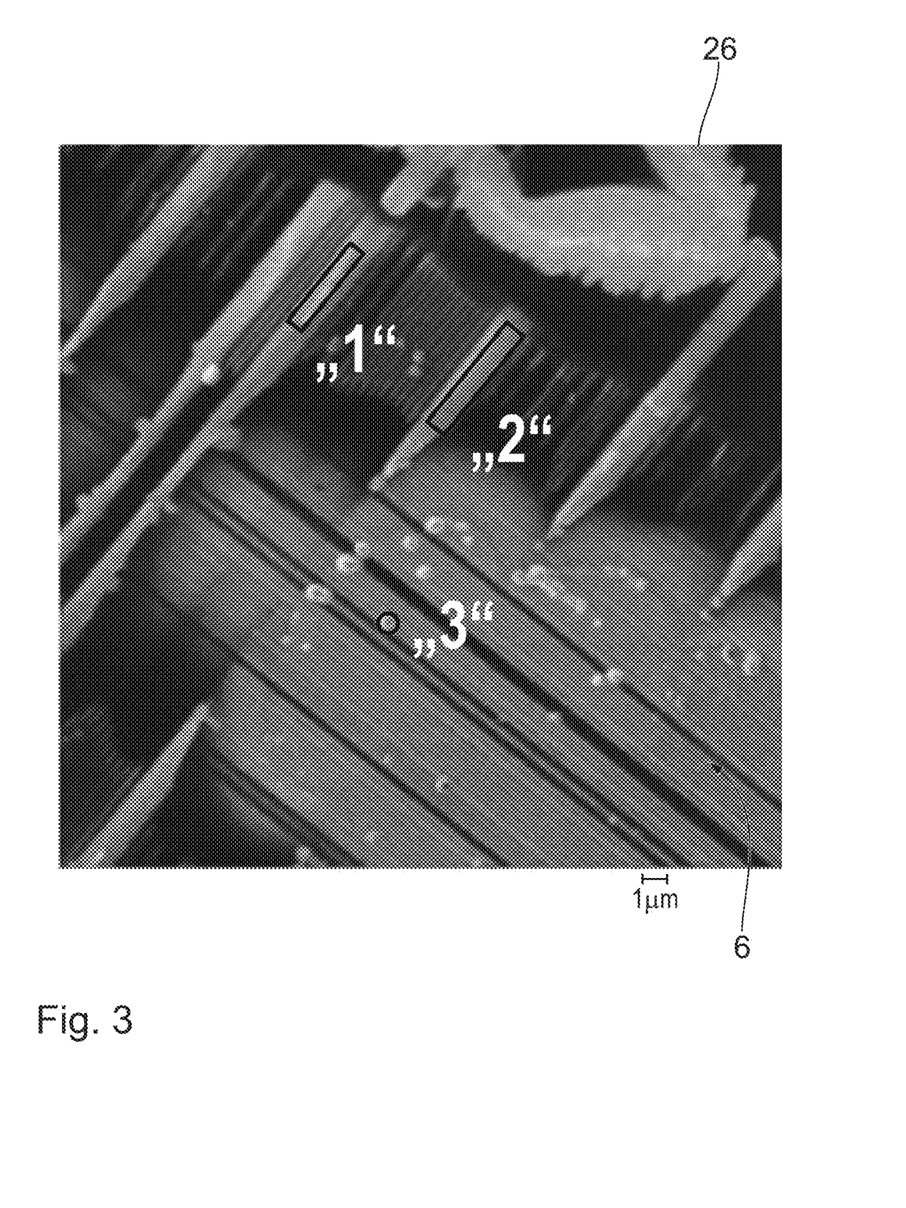
FIG. 3 a section of a microscope image obtained from the inspection system from secondary electrons produced by the inspection system.

FIG. 3 shows an example for such a raw review inspection step. Shown is a section of an object 6 to be qualified. Such sample area 26 of the object 6 is produced using a conventional secondary electron microscopy technique using the secondary electron optics 11 of the inspection system 1. The object 6 to be inspected includes several structural areas. Subareas "1", "2" and "3" of these object structures to be further inspected are highlighted in FIG. 3.

Subarea "1" includes a ridge structure showing in the electron microscopy imaging some kind of plug without further definition. Subarea "2" shows a corresponding ridge without such plug. Subarea "3" is an example of a plurality of "outgrowth" structures being present at several locations on the sample area of the object 6 during the raw review step.

Those highlighted subareas "1", "2" and "3" serve as qualification volume candidates, which are identified in the raw review step. During the inspection method, these subareas "1", "2" and "3" now further undergo a detailed review during the inspection method. During this detailed review, a space resolved ion beam sputtering in the volume of the respective subarea "1", "2" and "3" is carried out by pointing the ion beam 3 to these subareas "1", "2" and "3". For each of these subareas "1", "2" and "3", the secondary ions (compare secondary ions 7 and 9 of FIG. 1) during the detailed review are detected in a time-resolved measurement. These detected secondary ions undergo a continues mass spectrometry using the secondary ion transfer unit and the mass spectrometer 13, i.e. using the secondary ion detection device 12 of the inspection system 1 as described above with reference to FIG. 2.

Figure 4:
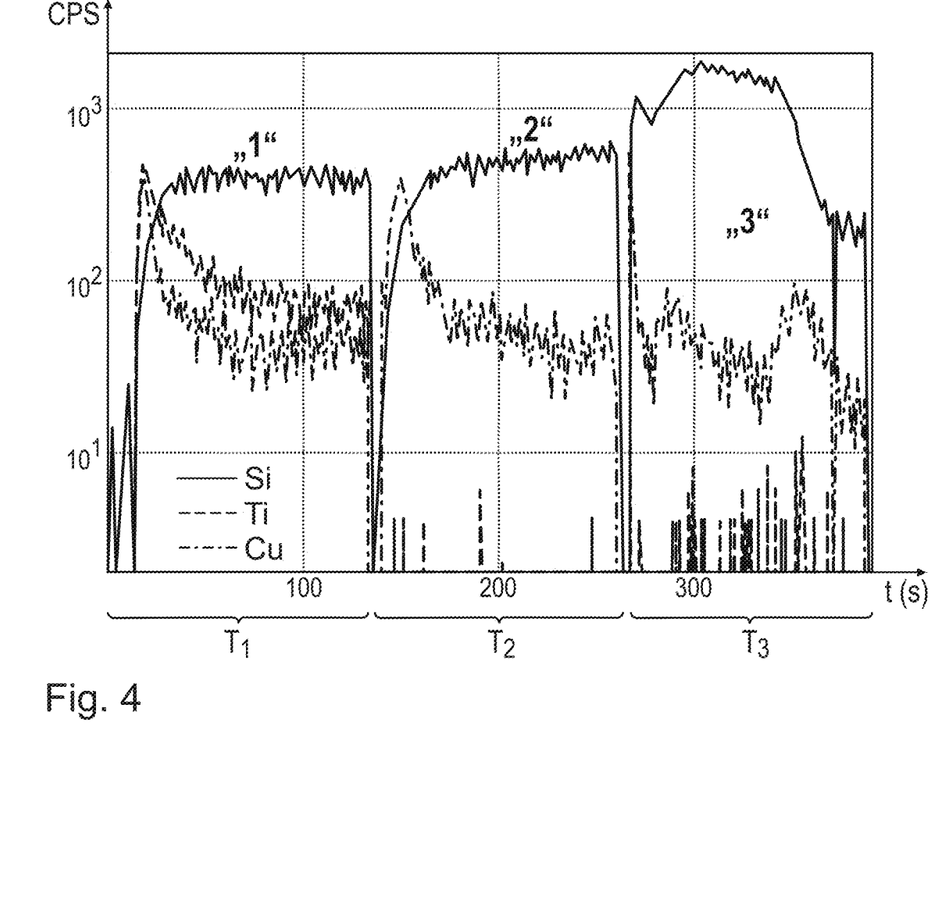
FIG. 4 a diagram of time-resolved count rate of three different ion energies measured by a mass spectrometer of the inspection system at three different locations within the object section shown in FIG. 3.

FIG. 4 shows the time-resolved results of the detailed review of the subareas "1", "2" and "3". The ordinate in the diagram of FIG. 4 is the measured count rate given in counts per seconds (CPS).

During the measurement, the ion beam 3 in a first time period $T_1$ is directed to subarea "1", in a following time period $T_2$ is directed to the subarea "2" and in a third and last time period $T_3$ is directed to the subarea "3".

Shown as a solid line, the count rate is given at a first ion energy level of the mass spectrometer 13 corresponding to silicon (Si). Shown as a dashed line, the count rate is given for an ion energy corresponding to titanium (Ti). Shown as a dashed-dotted line, the count rate is given for an ion energy corresponding to copper (Cu).

The time-resolved counting according to FIG. 4 further gives an information about a depth distribution of the occurrence of the respective elements Si, Ti, Cu. In the subarea "1", there is on the very surface titanium and copper present. As the ion beam 3 mills beneath the very surface of the subarea "1", the occurrence of titanium and copper drops down and the occurrence of the basic material silicon increases to be dominant after a short sampling time.

In the subarea "2", no titanium is present and the time-resolved behavior of the count rates relating to silicon and copper resembles that of the measurement of subarea "1". From a comparison of the measurements of subareas "1" and "2", it can be deduced that the plug shown in the secondary electron microscopy picture of FIG. 3 is a titanium plug.

The measurement at the "outgrowth" position of the subarea "3" reveals that there seem to be traces of titanium which are just above the resolution limit of the mass spectrometer 13. The time-resolved behavior regarding the presence of silicon and copper resembles that in subareas "1" and "2". From a comparison of the count rate measurement of subarea "3" with those of subareas "1" and "2", it can be concluded that the "outgrowth" shown in the secondary electron microscopy image of FIG. 3 is of titanium.

A lateral space resolution regarding the detailed review step described above is better than 100 nm and in particular is better than 75 nm, better than 50 nm and better than 30 nm. The lateral space resolution, i.e. the resolution in x and y, can be 20 nm or even better. The depth resolution (z direction) depends on the milling rate of the ion beam 3 in the material of the object 6. Such depth resolution also can be in the range of 100 nm or even better.

An accuracy regarding a surface area to be probed by ion beam 3 in the object field 4 may be better than 5 nm, may be better than 3 nm and even may be better than 1 nm. Such accuracy is decisive in particular when trying to capture probe structures like the "outgrowth" in subarea "3". Such more or less point-like subarea is detected via the raw review and its coordinates then are fed into a relative positioning control of the inspection system 1 to ensure that the beam interaction region 10 correctly is positioned at the subarea in question, e.g. at the subarea "3". To that end, the object 6 is positioned at a high positon xyz coordinate table having respective drive to move the object 6 in a well-defined manner with respect to these Cartesian coordinates x, y, z.

Such relative movement between the ion beam 3 on the one hand and the object 6 on the other in addition or alternatively may be realized by a scanning scheme to scan the ion beam 3, e.g. via at least one and in particular two scanning coils.

An xy extension of the beam interaction region 10, i.e. the diameter of the focus of the ion at the object field 4 may be smaller than 1 nm and in particular may be smaller than 0.5 nm.

The beam current may be smaller than 20 pA and may be smaller than 9 pA. Such a small beam current gives the possibility of a very high spatial resolution of the detailed review.

Figure 5:
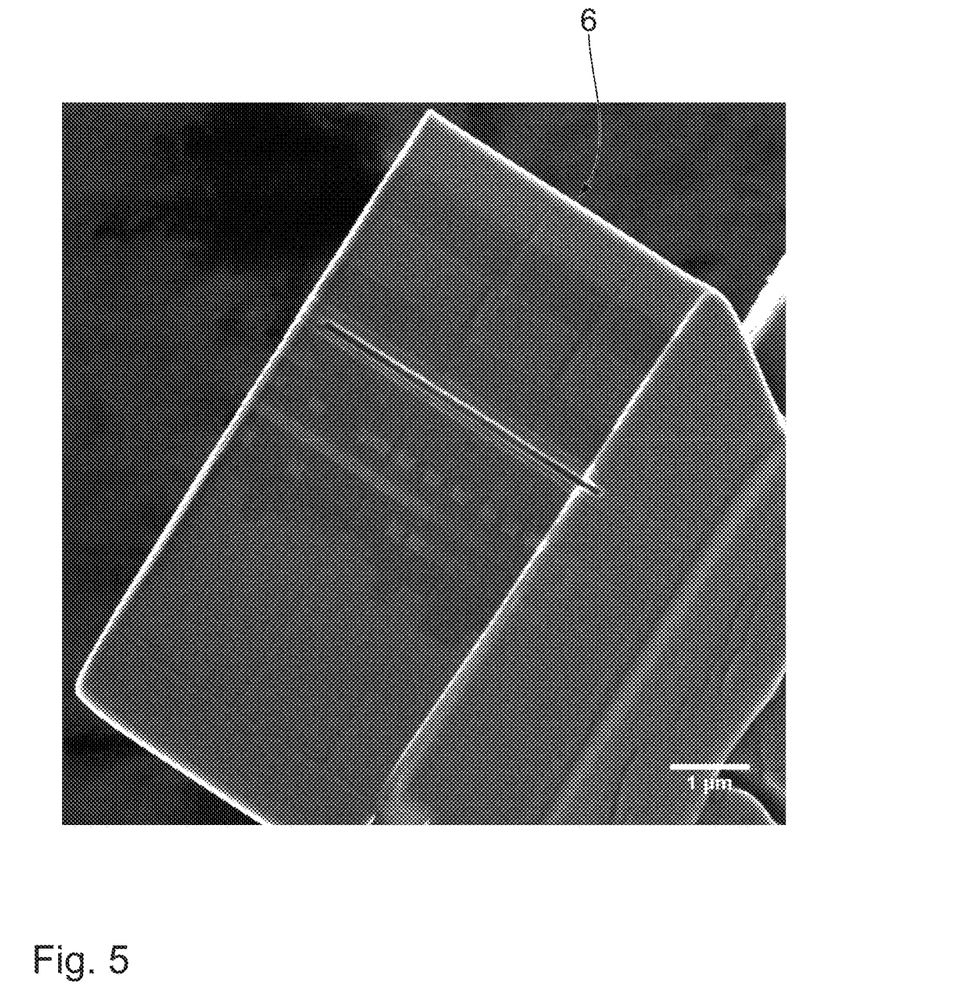
FIG. 5 as compared with FIG. 3 in a further enlarged scale, another section of the object imaged by secondary electrons by the inspection system prior to an object milling step by the ion beam.
Figure 6:
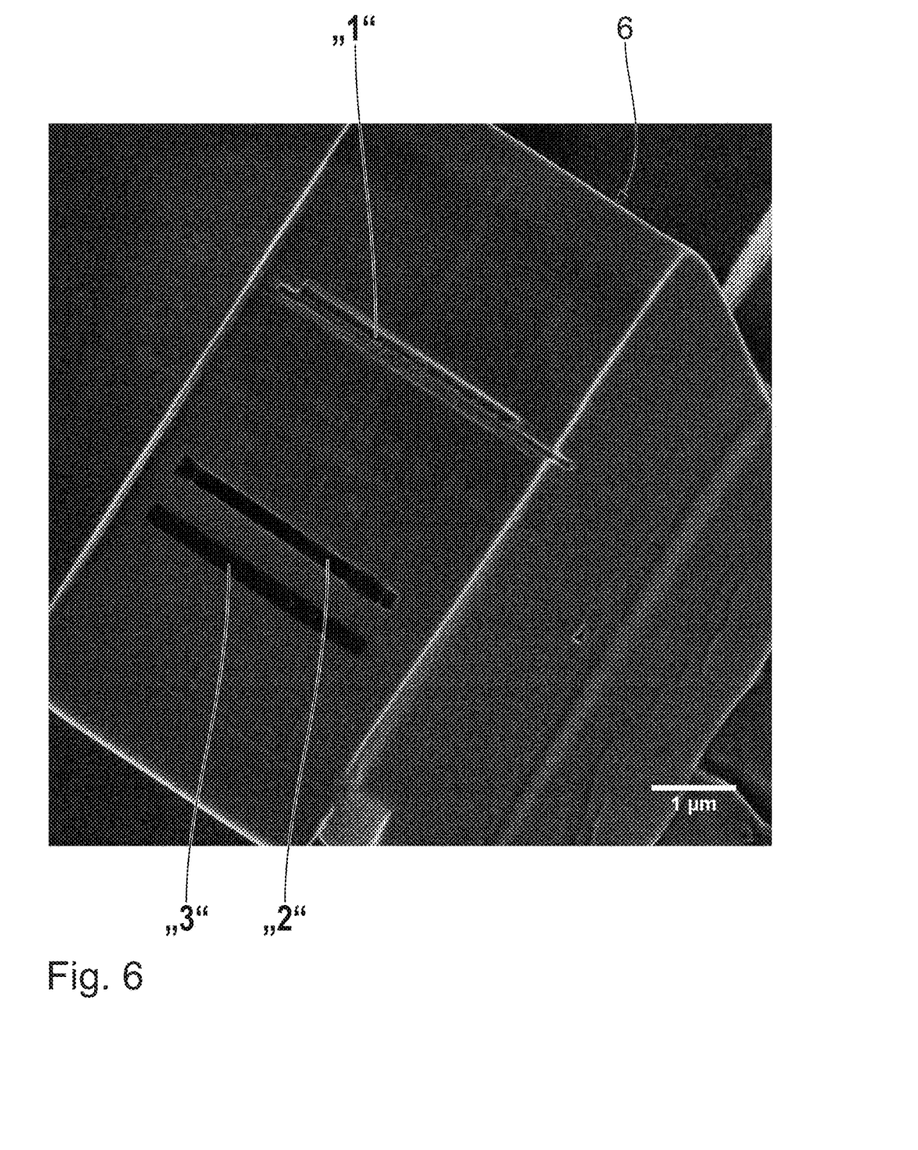
FIG. 6 the section according to FIG. 5 after the milling step showing three different milled rectangular sections.
Figure 7:
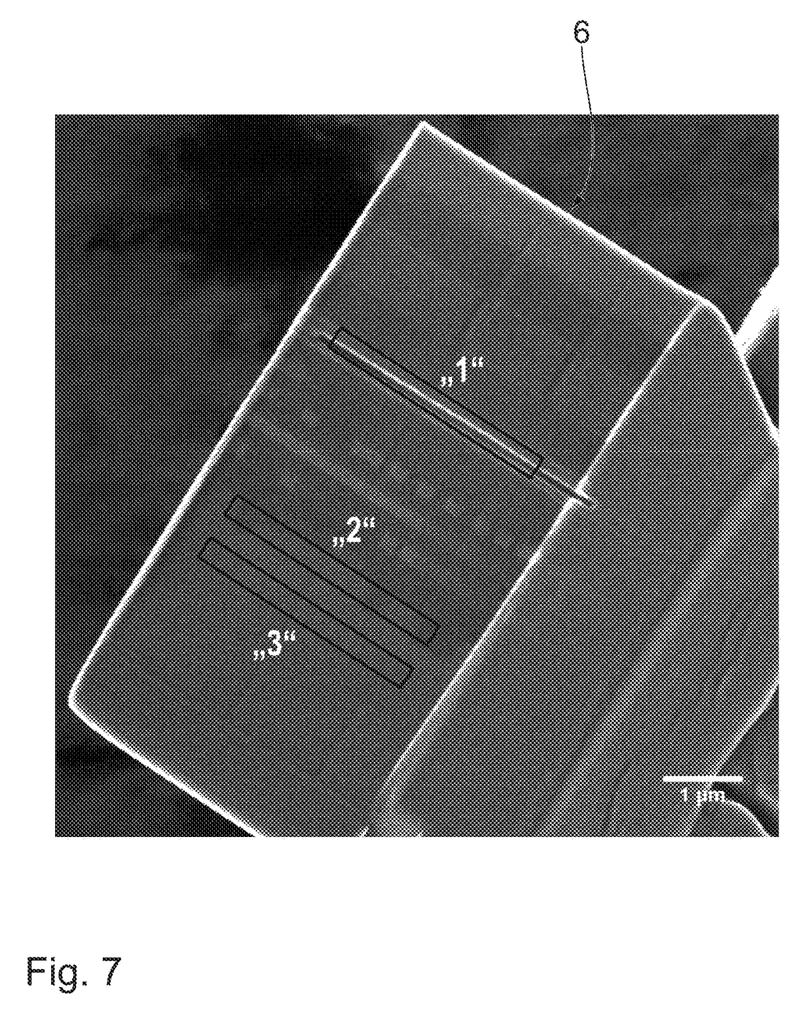
FIG. 7 the section of FIG. 6 wherein the milled areas are highlighted.

FIGS. 5 and 6 show on an enlarged spatial resolution, an anvil-like structure of the object 6 before a milling step (FIG. 5), i.e. before interaction of the ion beam 3 with the object 6, and after such milling steps (FIG. 6).

Shown is in FIG. 6 milling in three linear subareas "1", "2" and "3" having a longitudinal extension of approximately 3 μm and a lateral extension of approximately 200 nm.

FIG. 7 again shows the milled subareas "1", "2" and "3" of FIG. 6, now highlighted.

Figure 8:
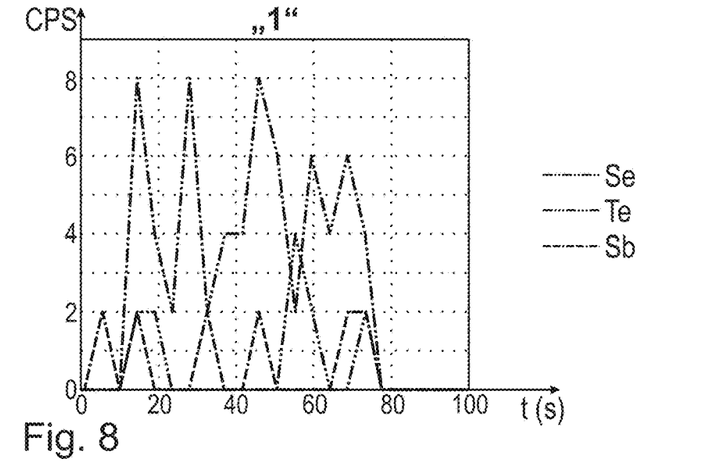
FIG. 8 in a time-resolved diagram comparable to FIG. 4, the time evaluation of three different measured ion energies derived from a first area highlighted in FIG. 7.
Figure 9:
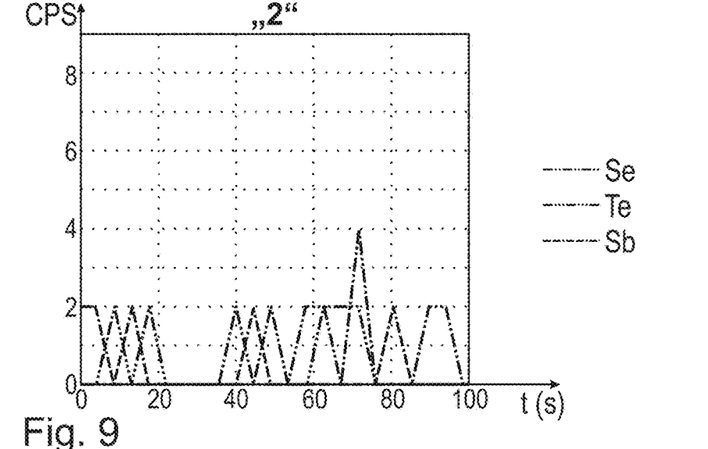
FIG. 9 in a time-resolved diagram comparable to FIG. 4, the time evaluation of three different measured ion energies derived from a second area highlighted in FIG. 7.
Figure 10:
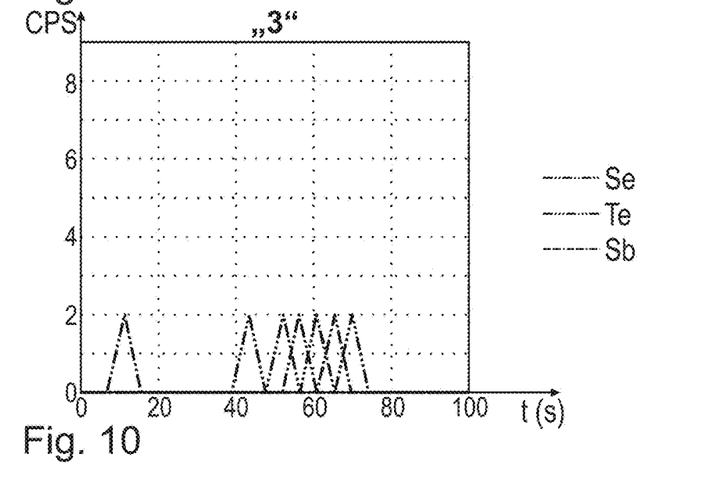
FIG. 10 in a time-resolved diagram comparable to FIG. 4, the time evaluation of three different measured ion energies derived from a third area highlighted in FIG. 7.

FIGS. 8 to 10 show in a diagram similar to that of FIG. 4 the count rates for ion energies corresponding to the elements selenium (Se), tellurium (Te) and antimony (Sb) measured by the secondary electron detection unit 12 of the inspection system 1 during the detailed review of the qualification volume candidates, i.e. subareas "1", "2" and "3" identified in the raw review step, i.e. during the electron microscopy imaging of FIG. 5.

FIG. 8 shows the time-resolved count rate for subarea "1". Such CPS result shows a relatively high share of selenium, accompanied by low shares close to the resolution limit of tellurium andantimony.

FIG. 9 shows the results of subarea "2" with low shares of all three elements selenium, tellurium andantimony. Selenium contributions in the CPS measurement according to FIG. 9 start to take place at longer milling time with the ion beam 3 indicating that in subarea "2", selenium is not directly present at the surface but underneath the surface.

FIG. 10 shows the time-resolved count rate measured in subarea "3". Selenium and tellurium are present near the resolution limit. No trace of antimony can be found in subarea "3".

The inspection method as described above in particular with respect to FIGS. 3 to 10 can be performed inline during a production of the semiconductor structure of the object 6. Examples for a projection lithography exposure method to produce semiconductor structures on a micrometer or nanometer scale are given in DE 10 2016 201 317 A1 and DE 10 2017 210 162 A1 and the references cited there. After an edging step, the respective three-dimensional structure produced in the object field 4 of the projection exposure apparatus emerges which then inline (in situ) can be reviewed via the inspection system 1 described above. Production errors, in particular systematic production errors than can be detected during the manufacturing process. Counteractions therefore are possible to reduce such manufacturing errors during the production process itself, therefore diminishing wastage.

What is claimed is:

1. An inspection system, comprising:
    an ion beam source configured to expose semiconductor structures with an ion beam in a spatially-resolved manner; and
    a secondary ion detection device comprising a mass spectrometer configured to simultaneously measure an ion mass to charge ratio in a given bandwidth,
    wherein the inspection system is configured to qualify the semiconductor structures.

2. The inspection system of claim 1, wherein the mass spectrometer is configured to continuously measure the ion mass to charge ratios in the given bandwidth.

3. The inspection system of claim 1, wherein the secondary ion detection device comprises a secondary ion detection unit.

4. The inspection system of claim 3, wherein the secondary ion detection unit comprises a total ion counter.

5. The inspection system of claim 3, wherein the secondary ion detection unit comprises an extended detector array for mass filtered signals.

6. The inspection system of claim 1, wherein the ion beam source is configured to produce a noble gas ion beam.

7. The inspection system of claim 1, wherein the ion beam source is configured to produce a neon ion beam.

8. The inspection system of claim 1, wherein the secondary ion detection device comprises a secondary ion transfer unit movable between:
    a first position in which the transfer unit is configured to transfer secondary ions emanating from a target volume of a probe structure to be qualified to the secondary ion detection unit; and
    a second position which is a neutral position.

9. The inspection system of claim 1, wherein:
    the mass spectrometer is configured to continuously measure the ion mass to charge ratios in the given bandwidth; and
    the secondary ion detection device comprises a secondary ion detection unit.

10. The inspection system of claim 1, wherein:
    the mass spectrometer is configured to continuously measure the ion mass to charge ratios in the given bandwidth; and
    the ion beam source is configured to produce a noble gas ion beam.

11. The inspection system of claim 1, wherein:
    the mass spectrometer is configured to continuously measure the ion mass to charge ratios in the given bandwidth; and
    the secondary ion detection device comprises a secondary ion transfer unit movable between:
        a first position in which the transfer unit is configured to transfer secondary ions emanating from a target volume of a probe structure to be qualified to the secondary ion detection unit; and
        a second position which is a neutral position.

12. The inspection system of claim 1, wherein:
    the secondary ion detection device comprises a secondary ion detection unit; and
    the ion beam source is configured to produce a noble gas ion beam.

13. The inspection system of claim 1, wherein:
    the secondary ion detection device comprises a secondary ion detection unit; and
    the mass spectrometer is configured to continuously measure the ion mass to charge ratios in the given bandwidth; and
    the secondary ion detection device comprises a secondary ion transfer unit movable between:
        a first position in which the transfer unit is configured to transfer secondary ions emanating from a target volume of a probe structure to be qualified to the secondary ion detection unit; and
    a second position which is a neutral position.

14. A method, comprising:
    using the inspection system of claim 1 to qualify semiconductor structures.

15. A method, comprising:
    raw review of a semiconductor structure to identify qualification volume candidates; and
    detailed review of the qualification volume candidates identified in the raw review,
    wherein, for each qualification volume candidate, the detailed review comprises:
        spatially-resolved ion beam sputtering;
        detecting secondary ions; and within an ion mass to charge ratio bandwidth, simultaneously using mass spectrometry to continuously analyze the detected secondary ions.

16. The inspection method of claim 15, wherein, during the detailed review, a lateral space resolution is greater than 100 nm.

17. The inspection method of claim 15, wherein, during the spatially-resolved ion beam sputtering, the ion beam has a focal diameter of less than 5 nm.

18. The inspection method of claim 15, comprising performing the inspection during a semiconductor production.

19. The inspection method of claim 15, further comprising using a secondary electron microscopy image to choose at least one of the qualification candidate volumes.

20. The inspection method of claim 15, further comprising:
    using the continuous mass spectrometry of the secondary ions to reveal a material distribution; and
    using a secondary electron microscope to image the material distribution.

* * * * *

UNITED STATES PATENT AND TRADEMARK OFFICE
CERTIFICATE OF CORRECTION

PATENT NO. : 11,378,532 B2
APPLICATION NO. : 17/129686
DATED : July 5, 2022
INVENTOR(S) : Lewis et al.

It is certified that error appears in the above-identified patent and that said Letters Patent is hereby corrected as shown below:

In the Specification

Column 3, Line 1, delete "andantimony" insert -- and antimony --.

Column 6, Line 5, delete "ionmass" insert -- ion mass --.

Column 6, Line 6, delete "ionmass" insert -- ion mass --.

Column 6, Line 7, delete "ionmass" insert -- ion mass --.

Column 6, Line 61, delete "FIG. 2)" insert -- FIG. 2). --.

Column 8, Line 50, delete "positon" insert -- position --.

Column 9, Line 20, delete "andantimony" insert -- and antimony --.

Column 9, Line 21, delete "andantimony" insert -- and antimony --.

Signed and Sealed this
Twenty-third Day of August, 2022

Katherine Kelly Vidal
*Director of the United States Patent and Trademark Office*